(12) United States Patent
Zhang et al.

(10) Patent No.: US 11,270,918 B2
(45) Date of Patent: Mar. 8, 2022

(54) LAMINATE STRUCTURE AND TEST METHOD FOR DETECTING INTER-METAL DIELECTRIC LAYER DEFECTS

(71) Applicant: MONTAGE TECHNOLOGY CO., LTD., Shanghai (CN)

(72) Inventors: Xiong Zhang, Shanghai (CN); Chunlai Sun, Shanghai (CN); Peichun Wang, Shanghai (CN); Gang Shi, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 70 days.

(21) Appl. No.: 16/423,040

(22) Filed: May 27, 2019

(65) Prior Publication Data
US 2019/0371685 A1    Dec. 5, 2019

(30) Foreign Application Priority Data
May 29, 2018  (CN) .......................... 201810531795.7

(51) Int. Cl.
*H01L 21/66* (2006.01)
*H01L 23/544* (2006.01)

(52) U.S. Cl.
CPC .............. *H01L 22/32* (2013.01); *H01L 22/12* (2013.01); *H01L 23/544* (2013.01); *H01L 2223/5446* (2013.01)

(58) Field of Classification Search
CPC ............ H01L 2223/5446; H01L 22/32; G01R 31/2853
See application file for complete search history.

(56) References Cited

U.S. PATENT DOCUMENTS

| 6,613,592 B1 | 9/2003 | Chen et al. |
| 7,973,547 B2 | 7/2011 | Nitsch et al. |

(Continued)

FOREIGN PATENT DOCUMENTS

| CN | 1445832 A | * 10/2003 |
| CN | 1445832 A |   10/2003 |

(Continued)

OTHER PUBLICATIONS

The First Office Action for Chinese Patent Application No. 201810531795.7, dated Nov. 4, 2020.

*Primary Examiner* — Raj R Gupta
(74) *Attorney, Agent, or Firm* — Jun He Law Offices P.C.; James J. Zhu

(57) ABSTRACT

The present application disclosed a conducting layer-dielectric layer-conducting layer (CDC) laminate structure and test method for detecting defects of an inter-metal dielectric layer. The laminate structure comprises: a dielectric layer formed on a substrate; a first conducting layer formed at a first side of the dielectric layer, wherein the first conducting layer includes a first metal region and at least one first opening in the first metal region; and a second conducting layer formed at a second side of the dielectric layer opposite to the first conducting layer such that the second conducting layer is separated from the first conducting layer by the dielectric layer, wherein the second conducting layer includes a second metal region and a plurality of second openings in the second metal region. The at least one first opening and the plurality of second openings are configured that a projection of the second metal region on the first conducting layer at least partially overlaps with the first metal region.

28 Claims, 11 Drawing Sheets

(56) References Cited

U.S. PATENT DOCUMENTS

2006/0154469 A1\* 7/2006 Hess .................. H01L 24/05
                                                    438/618
2019/0006237 A1\* 1/2019 Lee .................. B23K 1/0016

FOREIGN PATENT DOCUMENTS

| CN | 103681596 A | 3/2014 |
| CN | 104425440 A | 3/2015 |

\* cited by examiner

LAMINATE STRUCTURE AND TEST METHOD FOR DETECTING INTER-METAL DIELECTRIC LAYER DEFECTS

CROSS REFERENCE TO RELATED APPLICATIONS

The present application claims priority to Chinese Patent Application No. 201810531795.7 filed on May 29, 2018, the content of which is incorporated herein by reference.

FIELD OF THE INVENTION

The present application relates to semiconductor manufacturing technology, and more particularly to a laminate structure and test method for testing inter-metal dielectric layer defects, and a semiconductor wafer.

BACKGROUND

In integrated circuit fabrication, multi-layer metal interconnect structures are usually used to realize circuit connection. A dielectric material, also known as an inter-metal dielectric layer (IMD), is used between the multilayer metal interconnects to achieve electrical isolation. Conventional dielectric materials include silicon oxide and low dielectric constant (low-k) materials. However, due to the complexity of semiconductor manufacturing process, it is easy to form defects in the inter-metal dielectric layer, such as cracks, pinholes, particles, etc., thereby affecting dielectric performance of the inter-metal dielectric layer, causing electric leakage and resulting in yield and reliability issues.

Therefore, it is desired to detect defects in the inter-metal dielectric layer before chips are shipped out.

SUMMARY

An objective of the present application is to provide a laminate structure and test method for testing inter-metal dielectric layer defects, and a semiconductor wafer, thereby facilitating the detection of defects in inter-metal dielectric layers.

In a first aspect of the present application, a conducting layer-dielectric layer-conducting layer (CDC) laminate structure for detecting defects of an inter-metal dielectric layer is provided. The laminate structure comprises: a dielectric layer formed on a substrate; a first conducting layer formed at a first side of the dielectric layer, wherein the first conducting layer includes a first metal region and at least one first opening in the first metal region; and a second conducting layer formed at a second side of the dielectric layer opposite to the first such that the second conducting layer is separated from the first conducting layer by the dielectric layer, wherein the second conducting layer includes a second metal region and a plurality of second openings in the second metal region. The at least one first opening and the plurality of second openings are configured that a projection of the second metal region on the first conducting layer at least partially overlaps with the first metal region.

In a second aspect of the present application, a method for detecting defects of an inter-metal dielectric layer is provided. The method comprises: providing a substrate; forming, on the substrate, a conducting layer-dielectric layer-conducting layer (CDC) laminate structure for detecting defects of the inter-metal dielectric layer. The laminate structure comprising: a dielectric layer formed on the substrate; a first conducting layer formed at a first side of the dielectric layer, wherein the first conducting layer includes a first metal region and at least one first opening in the first metal region; and a second conducting layer formed at a second side of the dielectric layer opposite to the first conducting layer such that the second conducting layer is separated from the first conducting layer by the dielectric layer, wherein the second conducting layer includes a second metal region and a plurality of second openings in the second metal region. The at least one first opening and the plurality of second openings are configured that a projection of the second metal region on the first conducting layer at least partially overlaps with the first metal region. The method further comprises: testing the first conducting layer and the second conducting layer to detect defects of the dielectric layer.

In a third aspect of the present application, a semiconductor wafer is provided. The semiconductor comprises: a substrate having a plurality of semiconductor devices formed therein; an interconnect structure for interconnecting the plurality of semiconductor devices; an isolation layer for electrically isolating different portions of the interconnect structure; the laminate structure according to the first aspect of the present application. The interconnect structure includes a first sub-structure in the same layer as the first conducting layer and a second sub-structure in the same layer as the second conducting layer, and the isolation layer includes a sub-layer between the first sub-structure and the second sub-structure of the interconnect structure.

The above is a summary of the present application, and may be simplified, summarized, and omitted from the details. It is to be understood by those skilled in the art that the summary is only illustrative and not intended to limit the scope of the application in any way. The summary is not intended to identify key features or essential features of the claimed subject matter, and is not intended to be used as an aid in determining the scope of the claimed subject matter.

BRIEF DESCRIPTION OF THE DRAWINGS

The above and other features of the present application will be more fully understood from the following description and appended claims. It will be appreciated that these drawings depict only several embodiments of the present application, therefore not to be considered as limiting the scope of the present application. The content of the present application will be more clearly and in detail explained by the accompanying drawings.

FIG. 1b is a schematic diagram illustrating defects formed in an inter-metal dielectric layer of the metal interconnection structure of FIG. 1a;

DETAILED DESCRIPTION OF THE DRAWINGS

Figure 1A:
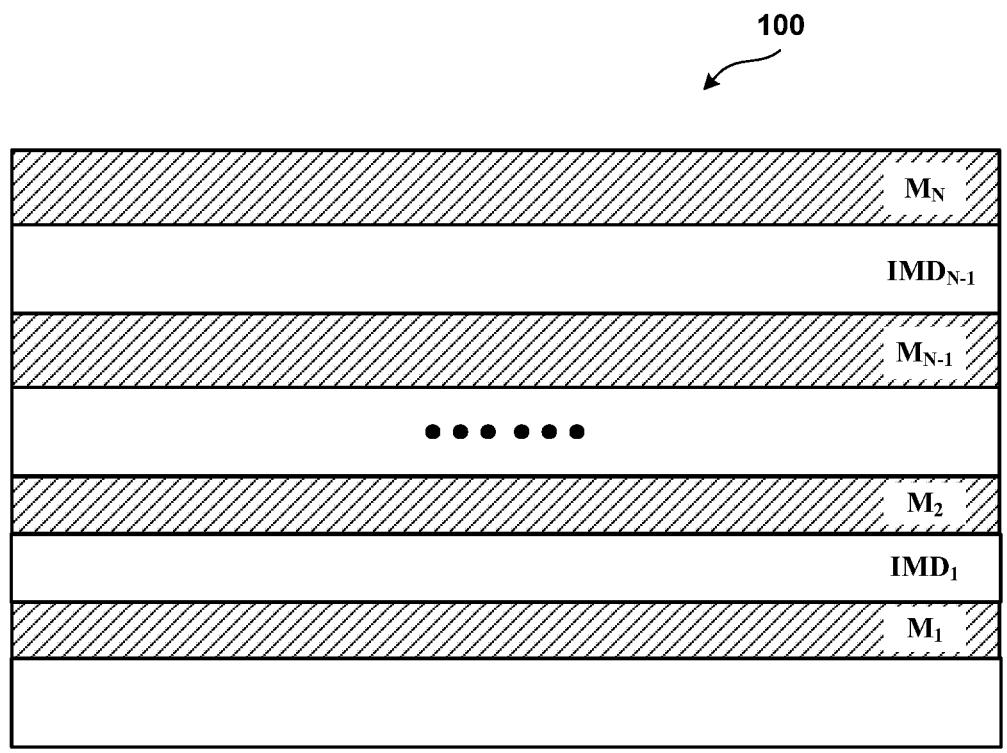
FIG. 1a illustrates a schematic diagram of a multilayer metal interconnect structure.

In the following detailed description, reference is made to the accompanying drawings that form a part thereof. In the drawings, like symbols generally indicate like components unless the context indicates otherwise. The illustrative embodiments described in the detailed description, drawings, and claims are not intended to be limiting. Other embodiments may be utilized, and other changes may be made, without departing from the spirit or scope of the subject matter of the application. It is to be understood that the various aspects of the subject matter of the present invention, which are generally described in the present application and illustrated in the accompanying drawings, can be configured, substituted, combined, and designed, all of which clearly constitute the content of the present application.

Referring to FIG. 1a, FIG. 1a illustrates a multilayer metal interconnect structure 100 including N metal layers $M_1, M_2, \ldots, M_{N-1}, M_N$, and inter-metal dielectric layers $IMD_1, \ldots, IMD_{N-1}$ respectively between the metal layers, where N is an integer between 3 and 15. The metal layer includes metal interconnect lines for electrically connecting semiconductor devices and circuit modules. Each dielectric layer is used to isolate two adjacent metal layers. Vias and conductive plugs are formed in the dielectric layers for electrically connecting different metal layers. In order to obtain better electrical isolation performance, it is generally required that the inter-metal dielectric layer should be uniform and free of defects, otherwise electric leakage between the metal layers may occur.

The material of the metal layer may include one or more of aluminum, silver, chromium, molybdenum, nickel, palladium, platinum, titanium, tantalum, copper, and in some embodiments, the material of the metal layer may preferably be copper or aluminum. For example, the material of a top metal layer $M_N$ is aluminum, and the material of the other metal layers $M_1, M_2, \ldots, M_{N-1}$ is copper. However, the metal layer may be any other suitable conductive materials in the art. The material of the inter-metal dielectric layer may be silicon oxide or a low-k material. Generally, in order to improve the adhesion between the metal material and the dielectric material and reduce the diffusion of the metal material into the dielectric material, an adhesion layer and/or a diffusion barrier layer, e.g. silicon carbide layer, titanium nitride layer or the like, may be formed between the metal layer and the inter-metal dielectric layer.

Figure 1B:
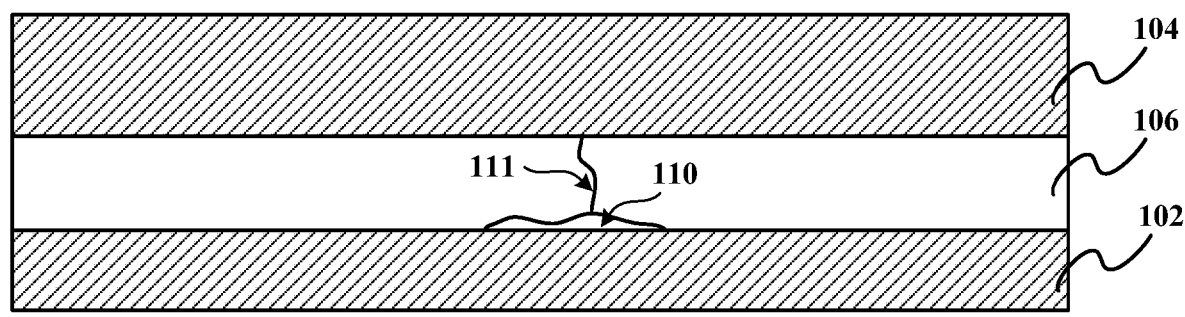

The inventors of the present application have found that low adhesion and mismatch in the coefficient of thermal expansion between the metal layer and the inter-metal dielectric layer may easily result in defects in the inter-metal dielectric layer, and further result in electric leakage. The top metal layer shown in FIG. 1b will be described below as an example, but the principle is also applicable to other instances. FIG. 1b illustrates an upper metal layer 104, a lower metal layer 102, and an inter-metal dielectric layer 106 therebetween, for example, they may be the metal layer $M_N$, the inter-metal dielectric layer $IMD_{N-1}$ and the metal layer $M_{N-1}$ in the metal interconnect structure 100 shown in FIG. 1a. In the embodiment, the material of the upper metal layer 104 is aluminum and is relatively thicker for power supply routing; while the material of the lower metal layer 102 is copper and is relatively thinner. Additionally, in order to reduce parasitic capacitance between the metal layers, the inter-metal dielectric layer 106 typically uses a low-k material, such as a carbon doped silicate or certain polymeric material. However, due to the poor adhesion between the low-k material and copper, a gap 110 is easily generated even in the presence of an additional adhesion layer between the low-k material and copper layers. In addition, since the difference in thermal expansion coefficient between low-k vs. aluminum and low-k vs. copper is significant, and the low-k material has a loose structure and low hardness, the stress generated from the thicker aluminum layer may result in crack 111 in the low-k material layer during the heating treatment of the semiconductor manufacturing process. Further, if copper atoms diffuse or migrate into the gap 110 or the crack 111, electric leakage between the upper metal layer 104 and the lower metal layer 102 may occur.

In order to detect defects in the inter-metal dielectric layer, embodiments of the present invention provide a conducting layer-dielectric layer-conducting layer (CDC) laminate structure for detecting defects in an inter-metal dielectric layer. With a specially-designed structure, defects can be more easily generated in the inter-metal dielectric layer under certain process conditions. Accordingly, when such structure for detecting defects of the inter-metal dielectric layer is fabricated on a same wafer where chips will be formed, if no defect is detected in the inter-metal dielectric layer of the structure, then it can be considered that the chips produced together with the structure may have no defects in their inter-metal dielectric layers. Conversely, if one or more defects are detected in the inter-metal dielectric layer of the structure, it is highly likely that inter-metal dielectric layer defects exist in the chips produced together with the structure. With such laminate structure, easy detection of defects in the inter-metal dielectric layer of a chip can be achieved, and wafer-level testing can be achieved.

Figure 2:
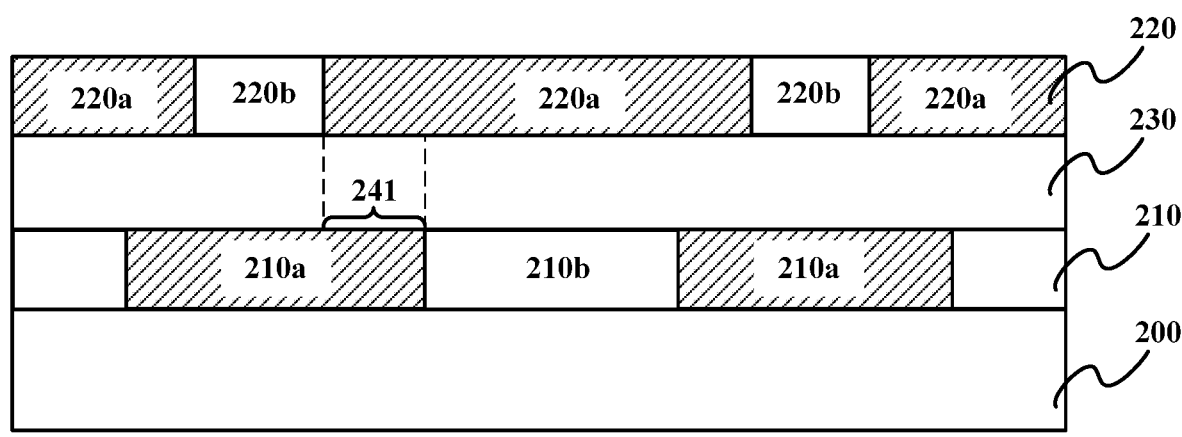
FIG. 2 is a cross-sectional diagram illustrating a laminate structure for detecting defects of an inter-metal dielectric layer according to an embodiment of the present application.

According to some embodiments of the present invention, referring to FIG. 2, a conducting layer-dielectric layer-conducting layer laminate structure for detecting defects of an inter-metal dielectric layer includes: a dielectric layer 230, a first conducting layer 210, and a second conducting layer 220. As shown in FIG. 2, the first conducting layer 210, the dielectric layer 230, and the second conducting layer 220 are sequentially formed on a substrate 200. The first conducting layer 210 is formed at a side of the dielectric layer 230, such as at the side adjacent to the substrate 200, and the first conducting layer 210 includes a first metal region 210a and at least one first opening 210b in the first metal region 210a. The second conducting layer 220 is formed at the other side of the dielectric layer 230 that is opposite to the first conducting layer 210, that is, the side away from the substrate 200 in FIG. 2. The second conducting layer 220 includes a second metal region 220a and a plurality of second openings 220b formed in the second metal region 220. In some embodiments, the first opening 210b can be filled with the material of the substrate 200 or the dielectric layer 230, and the second opening 220b can be filled with the material of the dielectric layer 230 or other dielectric material(s). In the above CDC laminate structure, the dielectric layer 230 is formed such that the first metal region 210a and the second metal region 220a are separated from each other, and the at least one first opening 210b and the plurality of second openings 220b are formed such that a projection of the second metal region 220a on the first conducting layer 210 at least partially overlaps with the first metal region 210a. For example, as shown in FIG. 2, the projection of the second metal region 220a on the first conducting layer 210 has at least one overlap region 241 that overlaps with the first metal region 210a. As described above, due to the low adhesion and the mismatch in the coefficient of thermal expansion between the metal layer and the dielectric layer, defects are more likely to be generated in the dielectric layer in the overlap region (e.g. the overlap region 241 in FIG. 2) between the first metal region 210a and the second metal region 220b, and it is helpful for detection. In some embodiments, the projection of at least one edge of the second opening 220b on the first metal region 210a is within the first metal region 210a, such that the edge projection constitutes an edge of the overlap region of the second metal region 220a and the first metal region 210a. The stress caused from the difference in thermal expansion coefficient can accumulate on the edge (i.e., the interface between the second opening 220b and the second metal region 220a) and reach a maximum value, and defects in the dielectric layer are more likely to be generated near the edge, which helps for detection. In some embodiments, the CDC laminate structure for detecting defects of an inter-metal dielectric layer may further include the substrate 200 as shown in FIG. 2, but the present application is not limited thereto, and may not include the substrate 200.

Further research shows that defects of an inter-metal dielectric layer may be likely generated in the following locations: (1) an opening in a metal layer with a large length and a width close to the minimum width/distance defined in the design rule; (2) an end of an opening in a metal layer; (3) a portion between ends of a plurality of metal patterns in a metal layer; (4) an asymmetry portion between a lower metal pattern and an upper metal pattern; and (5) a poor adhesive portion between a lower metal layer and an inter-metal dielectric layer.

Based on the above factors that affect the generation of defects in the inter-metal dielectric layer, the structure for detecting defects of the inter-metal dielectric layer of the present invention will be described below in conjunction with specific embodiments. Considering that the adhesion force between copper and the inter-metal dielectric layer is poor and aluminum generally has a large thickness as the top metal layer, copper and aluminum are described in the following as examples for the materials of the first conducting layer and the second conducting layer respectively. It should be noted that, in the following embodiments, the first conducting layer is illustratively described as under the second conducting layer, but the second conducting layer may also be formed under the first conducting layer according to different practical applications. It should also be understood that in other embodiments, the structure of the present invention for detecting defects of an inter-metal dielectric layer may also be implemented in other suitable electrically conducting materials, or in other conducting layers.

Figure 3A:
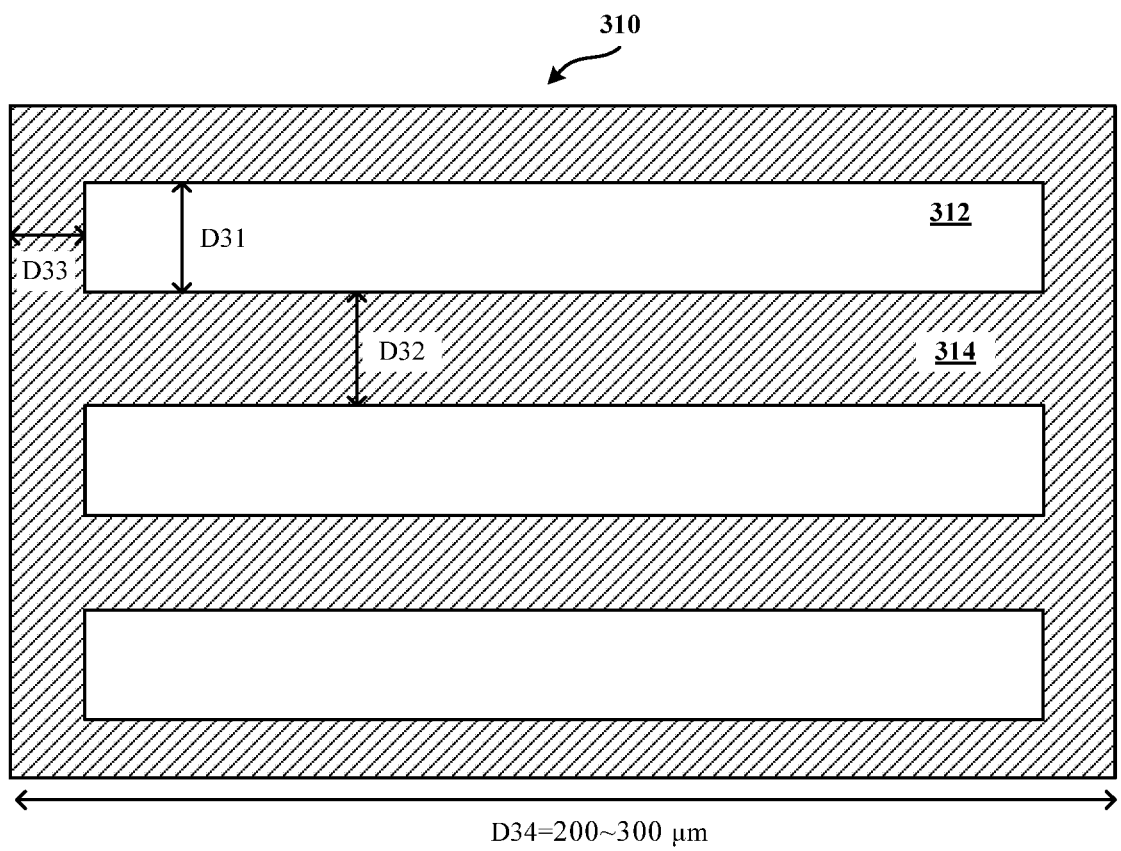
FIGS. 3a to 3c are schematic diagrams illustrating a structure for detecting defects of an inter-metal dielectric layer according to an embodiment of the present application.
Figure 3B:
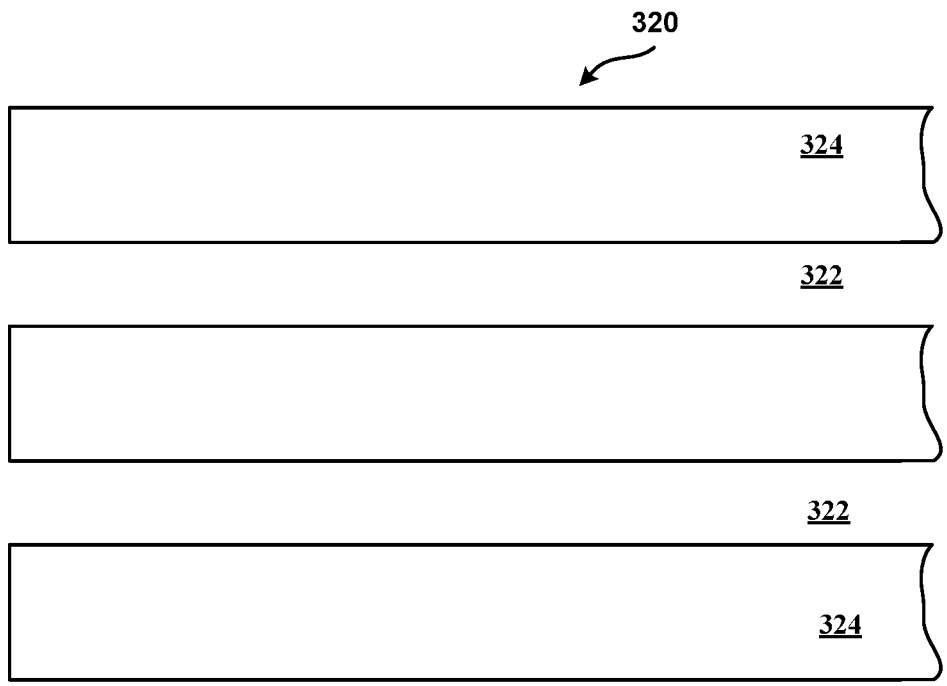

In one embodiment, FIG. 3a illustrates an aluminum layer 310 as a second conducting layer, and FIG. 3b illustrates a portion of a copper layer 320 as a first conducting layer. As shown in FIG. 3a, the aluminum layer 310 includes a continuous second metal region 314 and three elongated second openings 312 in the second metal region 314. The three second openings 312 are rectangular and arranged in parallel with each other in their lengthwise direction, each of the second openings has a width D31 of 1 to 1.2×A, and a distance D32 between two adjacent second openings is 0.5 to 1×B; where A represents a predetermined minimum spacing of a layout design rule in accordance with process conditions to avoid short circuits; B represents a predetermined maximum line width of traces in the layout design rule and is used to reduce adverse influence resulting from too large metal width. The lengthwise direction refers to a direction that a long edge of a rectangular shape/pattern follows, and a widthwise direction refers to another direction that a short edge of the rectangular shape/pattern follows. The values of A and B under different process conditions may vary, but should be consistent with the layout design rule of the chips to be produced and tested. For example, in some embodiments of the present application, A=2 nm; B=35 nm. With continued reference to FIG. 3a, a distance D33 from an outer edge of the second metal region 314 to a nearest second opening is 0.7 to 1×B, and thus a length of the second opening 312 and a width D34=200~300 μm of the second metal region 314 actually are close. It should be noted that although the number of the second openings 312 shown in FIG. 3a is three, in other embodiments, other numbers, for example, two, four or five, or the like may be provided. Referring to FIG. 3b, the copper layer 320 includes a first metal region and at least one first opening 322 in the first metal region, and the first metal region includes a plurality of metal strips 324 that are rectangular, arranged in parallel with each other and spaced apart by the first openings 322, and the number of the metal strips 324 is not less than the number of the second openings 312 of the aluminum layer 310. In some embodiments, the number of metal strips 324 in the copper layer 320 is equal to the number of second openings 312 in the aluminum layer 310. It is to be noted that although the plurality of metal strips 324 shown in FIG. 3b are spaced apart from each other, they may be connected together, at one or more location(s) not shown, by other portion of the first metal region. Thus, when a test voltage is applied to the first metal region by a pad electrically connected to the first metal region, all locations of the first metal region may have substantially the same test voltage.

Figure 3C:
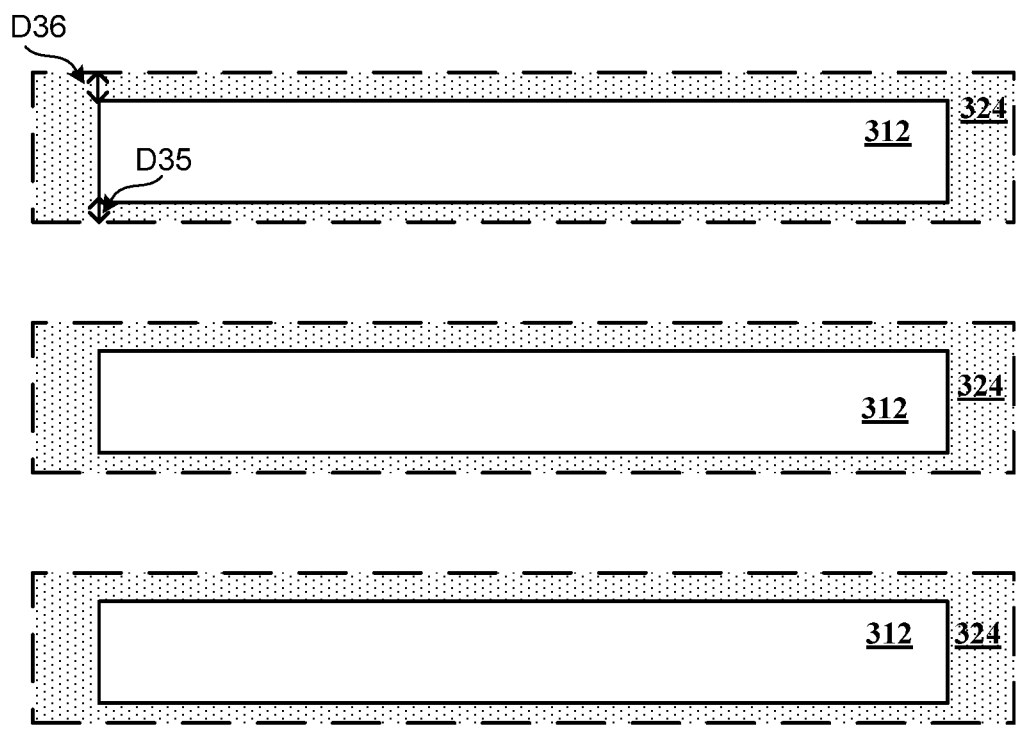

Referring next to FIG. 3c, FIG. 3c illustrates a relative positional relationship of the aluminum layer 310 and the copper layer 320 in the detection structure. For purpose of clarity, the inter-metal dielectric layer is not shown in FIG. 3c, and only the positional relationships between the second openings 312 in the aluminum layer 310 and the metal strips 324 in the copper layer 320 are shown. The shaded portion shows an overlap region of the second metal region 314 of the aluminum layer 310 with the metal strips 324 of the copper layer. As shown, a projection of each second opening 312 on the copper layer 320 is within a corresponding one of the metal strips 324, but distances D35 and D36 from the projections of the two long edges of each of the second openings to the nearest outer edges of the corresponding metal strip are not equal to each other, for example, D35=0~0.5 μm but D36=2~3 μm. That is, the metal strip 324 in the copper layer 320 is asymmetrical to the opening 312 in the aluminum layer 310. That is, the symmetry axis of the metal strip 324 in its lengthwise direction does not coincide with the symmetry axis of the corresponding second opening 312 in its lengthwise direction. In this embodiment, the width of the second opening 312 is close to the minimum spacing of the layout design rule, and its length is much larger than the width. When the structure expands upon heating, the stress caused from the difference in thermal expansion coefficient between the dielectric layer and the metal layer causes that the dielectric layer is pressed by the two metal layers, and the stress may accumulate in the elongated second opening 312 and reach a maximum value along the edges of the second opening 312. Further, since the lower metal layer is asymmetrical with respect to the upper metal layer, the stress can be further asymmetrically distributed, i.e. larger on a certain long edge of the second opening. Thus, it is easier to generate defects in the dielectric layer, which facilitates monitoring of defects in the dielectric layer.

Figure 4A:
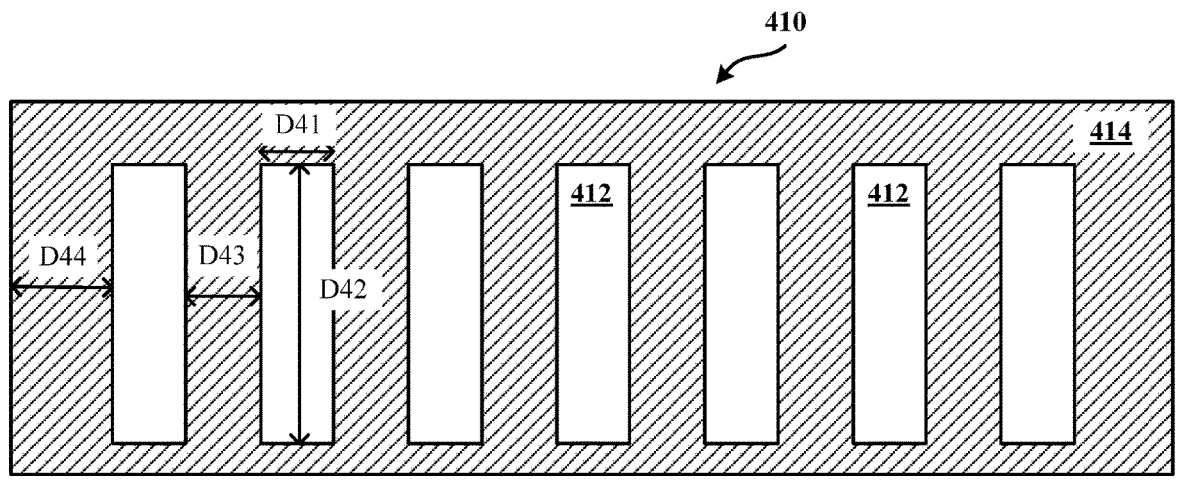
FIGS. 4a to 4b are schematic diagrams illustrating a structure for detecting defects of an inter-metal dielectric layer according to another embodiment of the present application.
Figure 4B:
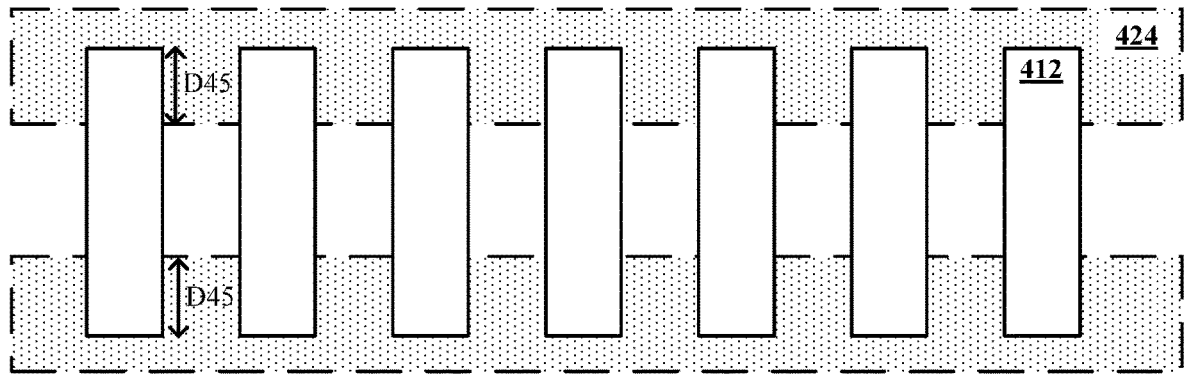

In another embodiment, referring to FIG. 4a and FIG. 4b, wherein FIG. 4a illustrates an aluminum layer 410 as a second conducting layer, and FIG. 4b illustrates a relative positional relationship of the aluminum layer 410 and the copper layer in the detection structure. As shown in FIG. 4a, the aluminum layer 410 includes a continuous second metal region 414 and a plurality of second openings 412 in the second metal region 414. The plurality of second openings 412 are rectangular and are arranged in parallel with other in their lengthwise direction. Each of the second openings 412 has a width D41 of 1 to 1.2×A, a length D42 of 3 to 10×A, and a distance D43 between two adjacent second openings 412 is 0.7 to 1×B. A distance D44 from an outer edge of the second metal region 414 to the nearest second opening 412 is also 0.7 to 1×B.

The copper layer in this embodiment is similar to the copper layer shown in FIG. 3b, and therefore is not shown separately. Only a positional relationship between two rectangular metal strips 424 that are arranged in parallel with each other in the copper layer and the second openings 412 in the aluminum layer are shown in FIG. 4b. As shown in FIG. 4b, projections of short edges of each second opening 412 on the copper layer are within two metal strips 424 respectively, and a length D45 of each short edge projected within the metal strip is greater than 2×A. In this embodiment, a plurality of short edges of the second openings 412 are projected within the copper metal strips 424, and the stress caused from the difference in thermal expansion coefficient between the dielectric layer and the metal layer causes that the dielectric layer is pressed by the metal layers in three directions after thermal expansion of the metal layers. The stress will accumulate and reach a maximum value at the end of the second opening 412. Further, since the end of the second opening 412 are projected within the lower metal layer and the adhesion between the dielectric layer and the lower metal layer at the end is worse, it is easier to generate defects in the dielectric layer, which is advantageous for monitoring defects in the dielectric layer.

Figure 5A:
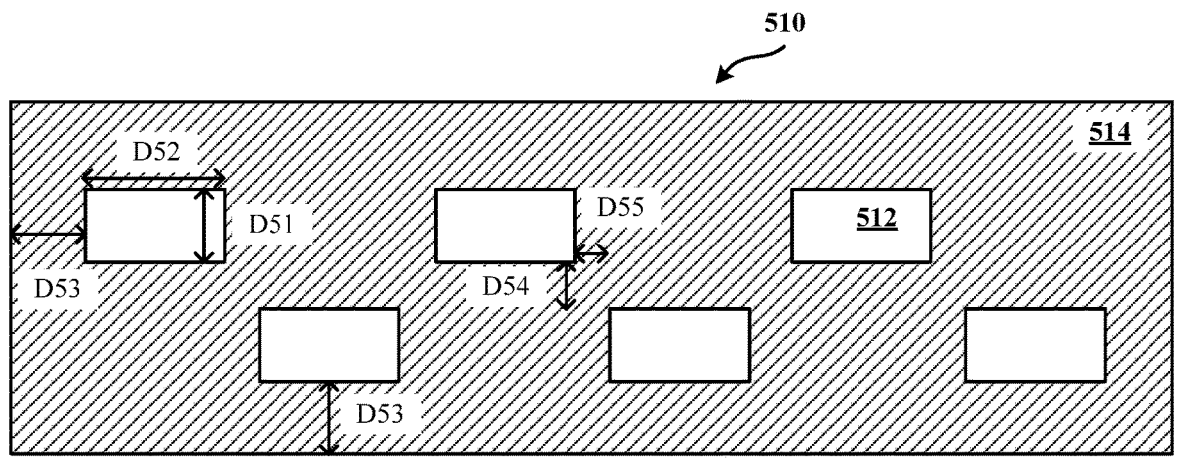
FIGS. 5a to 5b are schematic diagrams illustrating a structure for detecting defects of an inter-metal dielectric layer according to yet another embodiment of the present application.
Figure 5B:
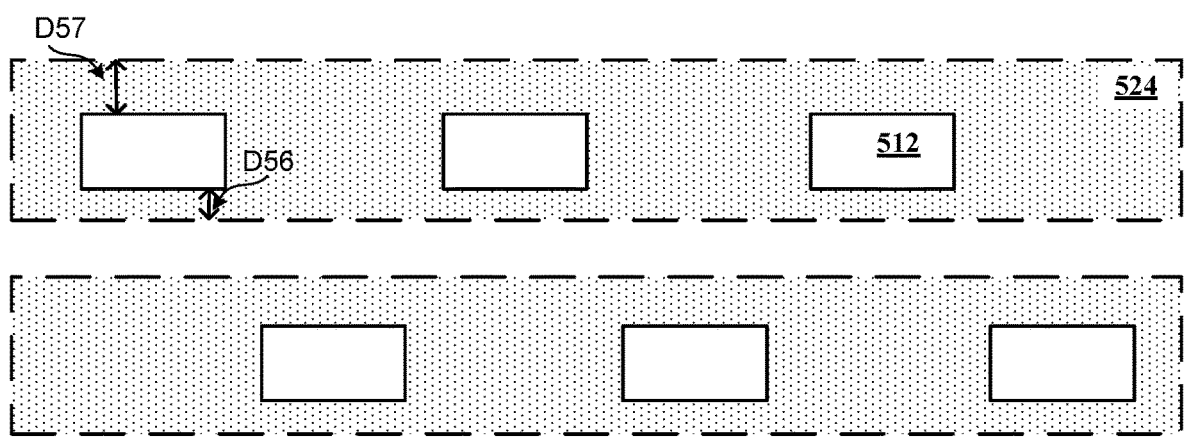

In still another embodiment, FIG. 5a illustrates an aluminum layer 510 as a second conducting layer, and FIG. 5b illustrates a relative positional relationship between the aluminum layer 510 and the copper layer in the detection structure. As shown in FIG. 5a, the aluminum layer 510 includes a continuous second metal region 514 and a plurality of second openings 512 in the second metal region 514. The plurality of second openings 512 are rectangular and arranged in at least two rows in parallel with each other in their lengthwise direction, and each of the second openings 512 has a width D51 of 1 to 1.2×A and a length D52 of 3 to 10×A. A distance D55 between two nearest vertexes of two second openings 512 in different rows in a row direction is 1 to 1.2×A, and a distance D54 between two nearest vertexes of two second openings 512 in different rows in a column direction is 1 to 1.2×A, wherein the column direction is perpendicular to the row direction. A distance D53 from an outer edge of the second metal region 514 to the nearest second opening 512 is 0.7 to 1×B.

The copper layer in this embodiment is also similar to the copper layer shown in FIG. 3b, and therefore is not shown separately. Only a positional relationship between two rectangular metal strips 524 that are arranged in parallel with each other and the second openings 512 in the aluminum layer are shown in FIG. 5b. As shown in FIG. 5b, the projections of the second openings 512 of each row on the first conducting layer are in the corresponding one of the metal strips 524, and the projections of the two long edges of each of the second openings 512 on the first conducting layer are apart from the nearest outer edges of the metal strip 524 by a distances D56 of 0 to 0.5 μm and D57 of 2 to 3 μm, respectively. That is, the metal strip 524 in the copper layer is asymmetrical to the opening 512 in the aluminum layer. In other words, the axis of symmetry of the metal strip 524 in the row direction does not coincide with the axis of symmetry of each second opening 512 in the row direction. In this embodiment, the distance between the vertexes of two second openings 512 is close to the minimum spacing of the design rule. Due to the layout or pattern effect, the stress caused from the difference in thermal expansion coefficient may accumulate between the two vertexes and reach a maximum value. In addition, since the two vertexes are also projected onto the lower metal layer, the adhesion between the dielectric layer and the lower metal layer at the vertexes is worse, and it is easier to generate defects in the dielectric layer, which is advantageous for monitoring defects of the dielectric layer.

Figure 6A:
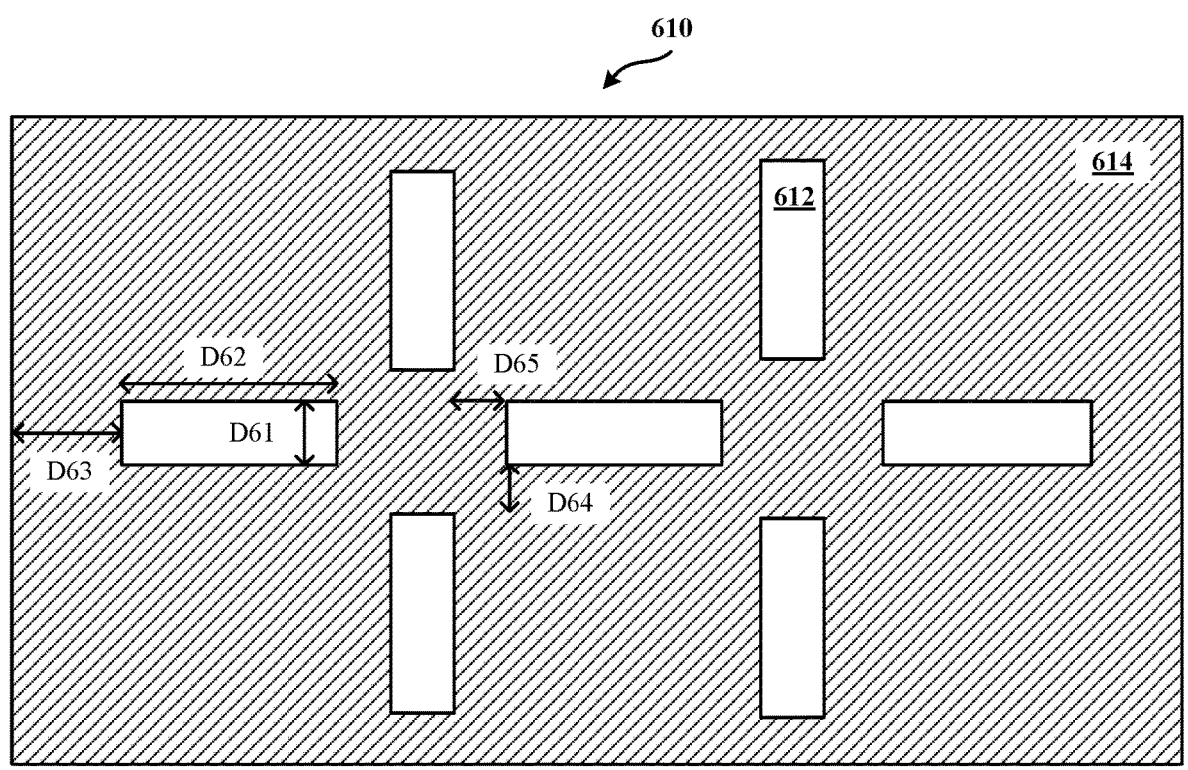
FIGS. 6a to 6b are schematic diagrams illustrating a structure for detecting defects of an inter-metal dielectric layer according to still another embodiment of the present application.
Figure 6B:
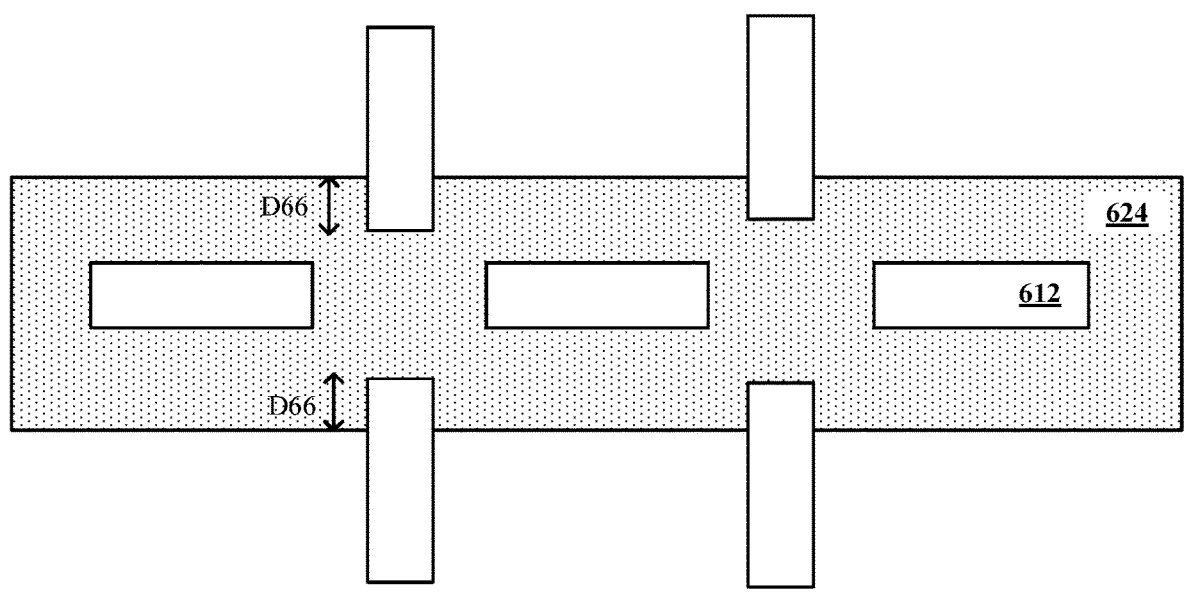

In still another embodiment, referring to FIG. 6a and FIG. 6b, wherein FIG. 6a illustrates an aluminum layer 610 as a second conducting layer, and FIG. 6b illustrates a relative positional relationship between an aluminum layer 610 and the copper layer in the detection structure. As shown in FIG. 6a, the aluminum layer 610 includes a continuous second metal region 614 and a plurality of second openings 612 in the second metal region 614. The plurality of second openings 612 are rectangular and constitute at least two sub-patterns, each sub-pattern includes four second openings 612, which are rotationally symmetric at a rotation angle of 90 degrees, i.e. in 4-fold rotational symmetry. In the embodiment illustrated in FIG. 6a, two sub-patterns share a second opening 612. Each second opening 612 has a width D61 of 1~1.2×A, a length D62 of 2~5×A. A distance D65 in a first direction between nearest vertexes of two adjacent second openings 612 is 1~1.2×A, a distance D64 in a second direction between nearest vertexes of two adjacent second openings 612 is 1 to 1.2×A, wherein the second direction is perpendicular to the first direction. A distance D63 from an outer edge of the second metal region 614 to the nearest second opening 612 is 0.7 to 1×B.

The copper layer in this embodiment is also similar to the copper layer shown in FIG. 3b, and therefore is not shown separately. Only a positional relationship between a metal strip 624 in the copper layer and the second openings 612 in the aluminum layer is shown in FIG. 6b. As shown in FIG. 6b, the plurality of second openings 612 constitute two sub-patterns, and projections of two linearly aligned second openings 612 of each sub-pattern on the first conducting layer are within a metal strip 624; and projections of the other two linearly aligned second openings 612 on the first conducting layer each has an end within the metal strip 624 and another end outside of the metal strip 624, and the end of the second opening that projected within the metal strip 624 have a length D66 larger than 2×A. In this embodiment, the condition that the four second openings 612 are close to each other is further considered. Due to the layout or pattern effect, the stress caused from the difference in thermal expansion coefficient accumulates and may reach a maximum value between the ends of the four second openings 612. In addition, since the four ends are also projected onto the lower metal layer, the adhesion between the dielectric layer and the lower metal layer at the ends is worse, and it is easier to generate defects in the dielectric layer, which is advantageous for monitoring defects of the dielectric layer.

It should be noted that, in the embodiments shown in FIGS. 3a to 6b, the CDC layer laminate structure for detecting defects of the inter-metal dielectric layer further includes a first test pad and a second test pad for electrical testing, wherein the first test pad is connected to the continuous first metal region in the first conducting layer, and the second test pad is connected to the continuous second metal region in the second conducting layer. The dielectric layer between the first conducting layer and the second conducting layer may be silicon oxide or a low-k material. In addition, no vias are formed and no dummy insertion and corner rounding treatment is performed between the first conducting layer and the second conducting layer, or at least in the overlap portion between the first metal region and the second metal region, so that inter-metal dielectric layer defects (if any) in the wafer are more likely to be generated in the detection structure to facilitate testing.

A plurality of embodiments of conducting layer-dielectric layer-conducting layer laminate structures for detecting defects of an inter-metal dielectric layer according to the present application are described above in connection with FIGS. 3a to 6b. However, it should be understood that the shapes and dimensions of the patterns presented in the figures are exemplary and can be adjusted by those skilled in the art depending on the particular application. In addition, the embodiments in FIGS. 3a-3c, FIGS. 4a-4b, FIGS. 5a-5b, and FIGS. 6a-6b provide a plurality of different detection structures. In a specific application, one or a combination of one or more detection structures may be selected for use, or may be used as a minimum repeating structure of an overall detection unit.

In addition, the present invention also provides a method of forming a structure for detecting defects of an inter-metal dielectric layer. The method uses a first conducting layer and a second conducting layer in the laminate structure described above to detect the presence or absence of defects in the dielectric layer.

Figure 7:
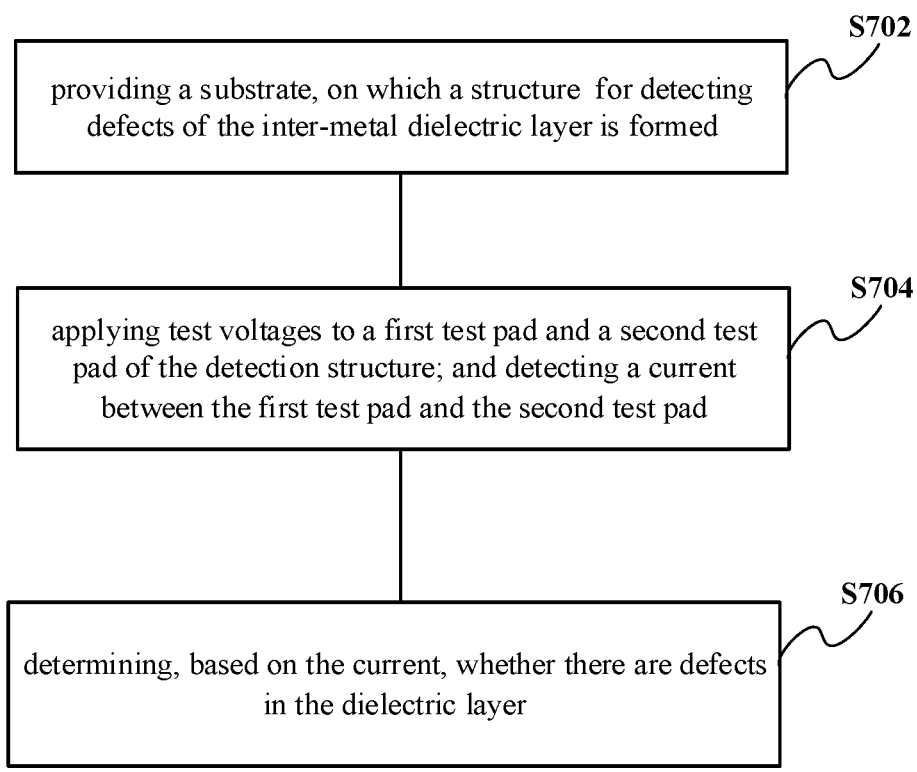
FIG. 7 is a flow chart illustrating a method for detecting defects of an inter-metal dielectric layer according to an embodiment of the present application.

Referring to FIG. 7, a method for detecting defects of an inter-metal dielectric layer in accordance with one embodiment of the present invention is illustrated. In step S702, providing a substrate, on which a conducting layer-dielectric layer-conducting layer laminate structure for detecting defects of the inter-metal dielectric layer is formed. The laminate structure for detecting defects of the inter-metal dielectric layer includes: a dielectric layer formed on the substrate; a first conducting layer formed at a first side of the dielectric layer, wherein the first conducting layer includes a first metal region and at least one first opening in the first metal region; and a second conducting layer formed at a second side of the dielectric layer opposite to the first conducting layer, such that the second conducting layer is separated from the first conducting layer by the dielectric layer. The second conducting layer includes a second metal region and a plurality of second openings in the second metal region. The at least one first opening and the plurality of second openings are configured that a projection of the second metal region on the first conducting layer at least partially overlaps with the first metal region. The laminate structure further includes a first test pad connected to the first metal region, and a second test pad connected to the second metal region. Further details of the laminate structure can be referred to the above description, and are not described herein again.

In step S704, applying different test voltages to the first metal region and the second metal region; and detecting a current between the first metal region and the second metal region. For example, a step of applying a test voltage and monitoring a current may be performed via the first test pad and the second test pad described above. Next, in step S706, determining, based on the current, whether there are defects in the dielectric layer.

Specifically, in some embodiments, a potential difference between two test pads can be gradually increased from 0, and a current between the two test pads is detected. When the current rises significantly, the potential difference between the two test pads can be considered as a breakdown voltage of the inter-metal dielectric layer. The measured breakdown voltage is compared with a threshold range. When the breakdown voltage is less than the threshold, it is considered that there is one or more defects in the inter-metal dielectric layer between the first conducting layer and the second conducting layer. This is because after the occurrence of dielectric layer defects, the metal (copper) will diffuse into the dielectric layer, forming a conducting path or reducing effective isolation distance. The above threshold range may be determined according to a specific process and dielectric material, or may be determined by testing the breakdown voltage of a non-defective inter-metal dielectric layer determined in other manners. For example, the above threshold may range from 20 to 50 volts.

In other embodiments, a predetermined test voltage can be applied between two test pads while maintaining the voltage value constant, and the change in current between the two test pads over time is detected. If there is one or more defects in the inter-metal dielectric layer, the metal (copper) will diffuse into the dielectric layer, forming a conducting path in the inter-metal dielectric layer. In this case, if the test current increases significantly as the time of the voltage test increases, the insulation performance of the inter-metal dielectric layer is greatly reduced, and thus there may be one or more defects in the inter-metal dielectric layer.

It should be noted that, although the above embodiment has given a method of detecting defects of an inter-metal dielectric layer by using an electrical method based on the detection structure of the present invention, the present invention is not limited thereto. For example, in some embodiments, the dielectric layer between the first conducting layer and the second conducting layer may also be tested by an optical or electron microscope observation method to determine whether there is one or more defects in the inter-metal dielectric layer.

Further, the present invention also provides a semiconductor wafer including: a substrate having a plurality of semiconductor devices formed therein; an interconnect structure for interconnecting the plurality of semiconductor devices; an isolation layer for electrically isolating different portions of the interconnect structure; the conducting layer-dielectric layer-conducting layer laminate structure for detecting defects of an inter-metal dielectric layer as described above. The interconnect structure includes a first sub-structure in the same layer as the first conducting layer and a second sub-structure in the same layer as the second conducting layer, and the isolation layer includes a sub-layer between the first sub-structure and the second sub-structure of the interconnect structure. The first sub-structure and the second sub-structure described above are used to implement electrical interconnection of semiconductor devices in the wafer, such as providing power to semiconductor devices or achieving signal transmission and the like. The specific shape of the above laminate structure can be referred to the above description, for example, in combination with the specific description in FIG. 3a-FIG. 3c, FIG. 4a-FIG. 4b, FIG. 5a-FIG. 5b, and FIG. 6a-FIG. 6b, which will not be repeated here again.

In the above semiconductor wafer, the first sub-structure and the second sub-structure in the interconnect structure are respectively formed in the same layer as the first conductive layer and the second conductive layer in the laminate structure for testing, and the isolation layer also includes a sub-layer between the first sub-structure and the second sub-structure of the interconnect structure. That is, their structures have a corresponding relationship with the CDC laminate structure for testing. Further, in the actual wafer fabrication process, the two structures are also formed on the same substrate by the same manufacturing process and should have the same thickness, and undergo the same heating treatment process, then their mechanical and electrical properties are similar. By testing the laminate structure which is more likely to cause dielectric layer defects by using the test method described above, based on the judgment of whether or not defects are generated in the inter-metal dielectric layer of the laminate structure, it can be inferred that whether there is one or more detects in the sub-layer (which is actually also an inter-metal dielectric layer) of the isolation layer that are formed between the first sub-structure and the second sub-structure of the interconnect structure. Compared with the rules and patterns used in the existing chip design, the laminate structure and the detecting method disclosed in the embodiments of the present application can greatly improve the detectability and detection accuracy for the defects generated from stress. In addition, since the defects (cracks) in the dielectric layer are difficult to be found in the subsequent chip testing, the laminate structure and the detecting method disclosed in the embodiments of the present application can also reduce the probability that the defective chips be distributed to the terminal clients.

Figure 8:
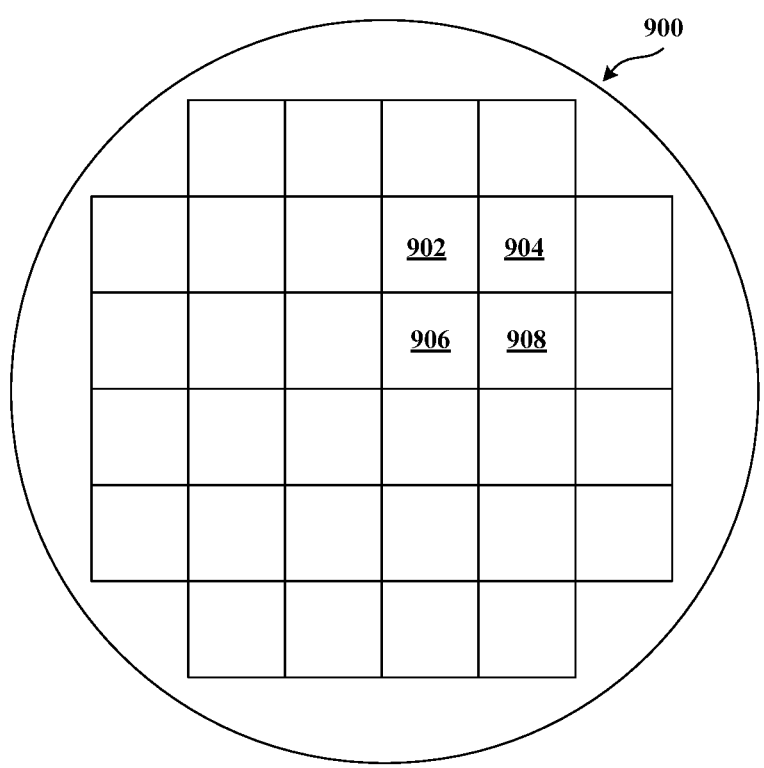
FIG. 8 illustrates a schematic diagram of a semiconductor wafer according to an embodiment of the present application.
Figure 9:
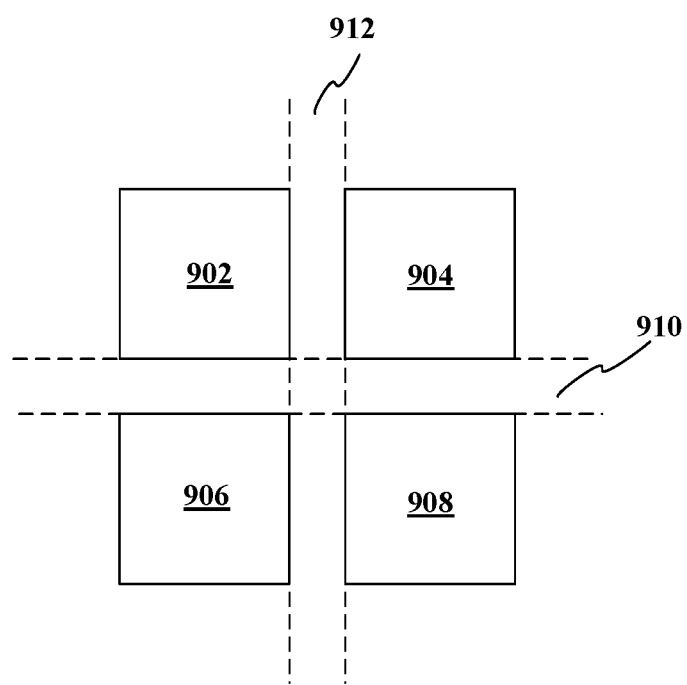
FIG. 9 is a partial enlarged view of the semiconductor wafer of FIG. 8.

Referring to FIGS. 8 and 9, wherein FIG. 8 illustrates a semiconductor wafer 900 according to an embodiment, and FIG. 9 is a partial enlarged view of FIG. 8. As shown, the semiconductor wafer 900 can include a plurality of chip regions, such as regions 902, 904, 906, and 908, and scribe line regions between the chip regions, such as regions 910 and 912. On a wafer, hundreds or thousands of chips are usually formed, and a certain gap is left between them, for example, a gap of 60 µm to 150 µm. This gap is called a scribe line. After the semiconductor fabrication process is completed and the chips are tested, the chips are cut from the wafer along the scribe line to form separate chips. In some embodiments, the semiconductor devices of the present invention are formed within the chip region, and the structure for detecting defects of an inter-metal dielectric layer is formed within the scribe line region, which can save chip area. In other embodiments, both the semiconductor devices of the present invention and the structure for detecting defects of an inter-metal dielectric layer may be formed in the chip region.

Other variations to the disclosed embodiments can be understood and implemented by those skilled in the art by studying the specification, drawings and accompanying drawing. In the claims, wording "include" does not exclude other elements and steps, and wordings "a" and "one" do not exclude plural. In the practical application of the present application, an element may perform the functions of a plurality of technical features cited in the claims. Any reference markers in the claims should not be construed as limiting the scope.

What is claimed is:

1. A conducting layer-dielectric layer-conducting layer (CDC) laminate structure for detecting defects of an inter-metal dielectric layer, the laminate structure comprising:
    a dielectric layer formed on a substrate;
    a first conducting layer formed at a first side of the dielectric layer, wherein the first conducting layer includes a first metal region and at least one first opening in the first metal region; and
    a second conducting layer formed at a second side of the dielectric layer opposite to the first conducting layer such that the second conducting layer is separated from the first conducting layer by the dielectric layer, wherein the second conducting layer includes a second metal region and a plurality of second openings within and surrounded by the second metal region;
    wherein the at least one first opening and the plurality of second openings are configured that a projection of the second metal region on the first conducting layer at least partially overlaps with the first metal region; and
    wherein the plurality of second openings are rectangular, the plurality of second openings comprise at least two sub-patterns each including four second openings arranged in a 4-fold rotational symmetry, projections of two linearly aligned second openings of the four second openings of each sub-pattern on the first conducting layer are within one of the plurality of metal strips, and projections of the other two linearly aligned second openings of the four second openings of each sub-pattern on the first conducting layer each has a first end within the metal strip and a second end outside of the metal strip.

2. The laminate structure of claim 1, wherein the plurality of second openings are rectangular and arranged in parallel with each other in their lengthwise direction, the first metal region includes a plurality of metal strips being rectangular and arranged in parallel with each other, and a projection of each of the plurality of second openings on the first conducting layer is within one of the plurality of metal strips.

3. The laminate structure of claim 2, wherein each second opening has a width of 1 to 1.2 times a predetermined minimum spacing of a design rule, and a spacing between two adjacent second openings is 0.5 to 1 times a predetermined maximum line width in the design rule, a distance from an outer edge of the second metal region to a nearest second opening is 0.7 to 1 times the predetermined maximum line width of the design rule, and projections of two long edges of each second opening on the first conducting layer are 0 to 0.5 µm and 2 to 3 µm from two nearest outer edges of a metal strip, respectively.

4. The laminate structure of claim 1, wherein the plurality of second openings are rectangular and arranged in parallel with each other in their lengthwise direction, the first metal region includes at least two metal strips arranged in parallel with each other, and projections of two short edges of each second opening on the first conducting layer are within two metal strips, respectively.

5. The laminate structure of claim 4, wherein each of the plurality of second openings has a width of 1 to 1.2 times a predetermined minimum spacing of a design rule and a length of 3 to 10 times the predetermined minimum spacing of the design rule; a spacing between two adjacent second openings is 0.7 to 1 times a predetermined maximum line width of the design rule, a distance from an outer edge of the second metal region to a nearest second opening is 0.7 to 1 times the predetermined maximum line width of the design rule, and the two short edges of the two metal strips are greater than twice the predetermined minimum spacing of the design rule.

6. The laminate structure of claim 1, wherein the plurality of second openings are rectangular and arranged in at least two rows in parallel with each other in their lengthwise direction, and one or more projections of one or more second openings in each of the at least two rows on the first conducting layer are within one of the plurality of metal strips.

7. The laminate structure of claim 6, wherein each second opening has a width of 1 to 1.2 times a predetermined minimum spacing of a design rule and a length of 3 to 10 times the predetermined minimum spacing of the design rule; a distance between two nearest vertexes of two second openings in different rows in a row direction is 1 to 1.2 times the predetermined minimum spacing of the design rule, a distance between two nearest vertexes of two second openings in different rows in a column direction is 1 to 1.2 times the predetermined minimum spacing of the design rule; a distance from an outer edge of the second metal region to a nearest second opening is 0.7 to 1 times a predetermined maximum line width of the design rule, and projections of two long edges of each second opening on the first conducting layer are 0 to 0.5 µm and 2 to 3 µm from two nearest outer edges of a metal strip, respectively.

8. The laminate structure of claim 1, wherein each second opening has a width of 1 to 1.2 times a predetermined minimum spacing and a length of 2 to 5 times the predetermined minimum spacing; a distance between two nearest vertexes of two adjacent second openings in a first direction is 1 to 1.2 times the predetermined minimum spacing, a distance between two nearest vertexes of two adjacent second openings in a second direction perpendicular to the first direction is 1 to 1.2 times the predetermined minimum spacing; a distance from an outer edge of the second metal region to a nearest second opening is 0.7 to 1 times a predetermined maximum line width, and a length of the first end that is projected within the metal strip is greater than twice the predetermined minimum spacing.

9. The laminate structure of claim 1, wherein a projection of at least one edge of the second opening on the first conducting layer is within the first metal region.

10. The laminate structure of claim 1, wherein the first conducting layer is formed under the second conducting layer with respect to the dielectric layer.

11. The laminate structure of claim 1, wherein the first conducting layer includes copper, and the second conducting layer includes aluminum.

12. A semiconductor wafer, comprising:
a substrate having a plurality of semiconductor devices formed therein;
an interconnect structure for interconnecting the plurality of semiconductor devices;
an isolation layer for electrically isolating different portions of the interconnect structure;
the laminate structure according to claim 1,
wherein the interconnect structure includes a first sub-structure in the same layer as the first conducting layer and a second sub-structure in the same layer as the second conducting layer, and the isolation layer includes a sub-layer between the first sub-structure and the second sub-structure of the interconnect structure.

13. The semiconductor wafer according to claim 12, wherein the semiconductor wafer includes a plurality of chip regions and a scribe line region between the plurality of chip regions, wherein the semiconductor devices, the interconnect structure and the isolation layer are located in the chip region, and the laminate structure is located in the scribe line region.

14. The laminate structure of claim 1, wherein there are no vias in a portion of the isolation layer corresponding to an overlap area between the projection of the second metal region on the first conducting layer and the first metal region.

15. A method for detecting defects of an inter-metal dielectric layer, the method comprising:
providing a substrate;
forming, on the substrate, a conducting layer-dielectric layer-conducting layer (CDC) laminate structure for detecting defects of the inter-metal dielectric layer, the laminate structure comprising a dielectric layer, a first conducting layer and a second conducting layer; and
testing the first conducting layer and the second conducting layer to detect defects of the dielectric layer;
wherein:
the dielectric layer is formed on the substrate;
the first conducting layer is formed at a first side of the dielectric layer, and the first conducting layer includes a first metal region and at least one first opening in the first metal region;
the second conducting layer is formed at a second side of the dielectric layer opposite to the first conducting layer such that the second conducting layer is separated from the first conducting layer by the dielectric layer, and the second conducting layer includes a second metal region and a plurality of second openings within and surrounded by the second metal region;
the at least one first opening and the plurality of second openings are configured that a projection of the second metal region on the first conducting layer at least partially overlaps with the first metal region; and
the plurality of second openings are rectangular, the plurality of second openings comprise at least two sub-patterns each including four second openings arranged in a 4-fold rotational symmetry, projections of two linearly aligned second openings of the four second openings of each sub-pattern on the first conducting layer are within one of the plurality of metal strips, and projections of the other two linearly aligned second openings of the four second openings of each sub-pattern on the first conducting layer each has a first end within the metal strip and a second end outside of the metal strip.

16. The method of claim 15, wherein testing the first conducting layer and the second conducting layer to detect defects of the dielectric layer comprises:
applying different test voltages to the first metal region and the second metal region;
detecting a current between the first metal region and the second metal region; and
determining, based on the current, whether there is one or more defects in the dielectric layer.

17. The method of claim 15, wherein the plurality of second openings are rectangular and arranged in parallel with each other in their lengthwise direction, the first metal region includes a plurality of metal strips being rectangular and arranged in parallel with each other, and a projection of each of the plurality of second openings on the first conducting layer is within one of the plurality of metal strips.

18. The method of claim 17, wherein each second opening has a width of 1 to 1.2 times a predetermined minimum spacing of a design rule, and a spacing between two adjacent second openings is 0.5 to 1 times a predetermined maximum line width in the design rule, a distance from an outer edge of the second metal region to a nearest second opening is 0.7 to 1 times the predetermined maximum line width of the design rule, and projections of two long edges of each second opening on the first conducting layer are 0 to 0.5 µm and 2 to 3 µm from two nearest outer edges of a metal strip, respectively.

19. The method of claim 15, wherein the plurality of second openings are rectangular and arranged in parallel with each other in their lengthwise direction, the first metal region includes at least two metal strips arranged in parallel with each other, and projections of two short edges of each second opening on the first conducting layer are within two metal strips, respectively.

20. The method of claim 19, wherein each second opening has a width of 1 to 1.2 times a predetermined minimum spacing of a design rule and a length of 3 to 10 times the predetermined minimum spacing of the design rule; a spacing between two adjacent second openings is 0.7 to 1 times a predetermined maximum line width in the design rule, a distance from an outer edge of the second metal region to a nearest second opening is 0.7 to 1 times the predetermined maximum line width of the design rule, and the two short edges of the two metal strips are greater than twice the predetermined minimum spacing of the design rule.

21. The method of claim 15, wherein the plurality of second openings are rectangular and arranged in at least two rows in parallel with each other in their lengthwise direction, and one or more projections of one or more second openings in each of the at least two rows on the first conducting layer are within one of the plurality of metal strips.

22. The method of claim 21, wherein each second opening has a width of 1 to 1.2 times a predetermined minimum spacing of a design rule and a length of 3 to 10 times the predetermined minimum spacing of the design rule; a distance between two nearest vertexes of two second openings in different rows in a row direction is 1 to 1.2 times the predetermined minimum spacing of the design rule, a distance between two nearest vertexes of two second openings in different rows in a column direction is 1 to 1.2 times the predetermined minimum spacing of the design rule; a distance from an outer edge of the second metal region to a nearest second opening is 0.7 to 1 times a predetermined maximum line width of the design rule, and projections of two long edges of each second opening on the first conducting layer are 0 to 0.5 µm and 2 to 3 µm from two nearest outer edges of a metal strip, respectively.

23. The method of claim 15, wherein each second opening has a width of 1 to 1.2 times a predetermined minimum spacing and a length of 2 to 5 times the predetermined minimum spacing; a distance between two nearest vertexes of two adjacent second openings in a first direction is 1 to 1.2 times the predetermined minimum spacing, a distance between two nearest vertexes of two adjacent second openings in a second direction perpendicular to the first direction is 1 to 1.2 times the predetermined minimum spacing; a distance from an outer edge of the second metal region to a nearest second opening is 0.7 to 1 times a predetermined maximum line width, and a length of the first end that is projected within the metal strip is greater than twice the predetermined minimum spacing.

24. The method of claim 15, wherein a projection of at least one edge of the second opening on the first conducting layer is within the first metal region.

25. The method of claim 15, wherein the first conducting layer is formed under the second conducting layer with respect to the dielectric layer.

26. The method of claim 15, wherein the first conducting layer includes copper, and the second conducting layer includes aluminum.

27. The method of claim 15, wherein the laminate structure is located in a scribe line region of a semiconductor wafer.

28. The method of claim 15, wherein there are no vias in a portion of the isolation layer corresponding to an overlap area between the projection of the second metal region on the first conducting layer and the first metal region.

\* \* \* \* \*